(12) United States Patent
Khalid et al.

(10) Patent No.: US 11,393,952 B1
(45) Date of Patent: Jul. 19, 2022

(54) MONOLITHIC NANOCOLUMN STRUCTURES

(71) Applicant: 4233999 Canada Inc., Westmount (CA)

(72) Inventors: Najeeb Ashraf Khalid, Westmount (CA); Huy Binh Le, Brossard (CA); Alexander Novikov, Hampstead (CA)

(*) Notice: Subject to any disclaimer, the term of this patent is extended or adjusted under 35 U.S.C. 154(b) by 0 days.

(21) Appl. No.: 17/578,123

(22) Filed: Jan. 18, 2022

Related U.S. Application Data

(60) Continuation of application No. 16/953,919, filed on Nov. 20, 2020, now abandoned, which is a division of application No. 17/007,919, filed on Aug. 31, 2020, now Pat. No. 11,094,846.

(51) Int. Cl.
| | | |
|---|---|---|
| *H01L 33/00* | (2010.01) | |
| *H01L 33/24* | (2010.01) | |
| *H01L 33/32* | (2010.01) | |
| *H01L 33/40* | (2010.01) | |
| *H01L 33/42* | (2010.01) | |

(52) U.S. Cl.
CPC .......... *H01L 33/24* (2013.01); *H01L 33/0075* (2013.01); *H01L 33/32* (2013.01); *H01L 33/405* (2013.01); *H01L 33/42* (2013.01); *H01L 2933/0016* (2013.01)

(58) Field of Classification Search
CPC .................................................. H01L 33/0075
USPC .......................................................... 438/46
See application file for complete search history.

(56) References Cited

U.S. PATENT DOCUMENTS

| | | |
|---|---|---|
| 10,177,195 B2 | 1/2019 | Ahmed et al. |
| 10,263,149 B2 | 4/2019 | Samuelson et al. |
| 10,651,341 B2 | 5/2020 | Amstatt et al. |
| 10,734,442 B2 | 8/2020 | Chio et al. |
| 11,094,846 B1 | 8/2021 | Khalid et al. |
| 2003/0168964 A1 | 9/2003 | Chen |
| 2009/0243043 A1 | 10/2009 | Wang |
| 2010/0207096 A1 | 8/2010 | Tang et al. |
| 2011/0012168 A1 | 1/2011 | Armitage |
| 2011/0169025 A1 | 7/2011 | Kishino et al. |
| 2011/0253982 A1 | 10/2011 | Wang et al. |
| 2012/0025232 A1 | 2/2012 | Gwo et al. |
| 2012/0261686 A1 | 10/2012 | Lu |
| 2013/0112944 A1 | 5/2013 | Cha et al. |
| 2014/0166974 A1 | 6/2014 | Yoo et al. |
| 2016/0155940 A1 | 6/2016 | Chen et al. |
| 2017/0279017 A1 | 9/2017 | Konsek et al. |
| 2017/0352601 A1 | 12/2017 | Hugon |
| 2018/0374988 A1 | 12/2018 | Mi et al. |
| 2019/0131345 A1 | 5/2019 | Ahmed et al. |
| 2019/0333963 A1 | 10/2019 | Chio et al. |
| 2019/0363069 A1 | 11/2019 | Ahmed et al. |

(Continued)

OTHER PUBLICATIONS

International application No. PCT/CA2021/051123 International Search Report dated Dec. 8, 2021.

(Continued)

*Primary Examiner* — Hsin Yi Hsieh
(74) *Attorney, Agent, or Firm* — Anglehart et al.

(57) ABSTRACT

The array of gallium-nitride (GaN) nanocolumns have quantum wells in a polar c-plane or in a semi-polar plane to emit light directed to ends of the nanocolumns and an interstitial filler material with light emitted in the nanocolumns being guided to exit from an end of the nanocolumns.

18 Claims, 12 Drawing Sheets

(56) References Cited

U.S. PATENT DOCUMENTS

| | | |
|---|---|---|
| 2020/0091388 A1* | 3/2020 | Chaji .................... H01L 33/44 |
| 2020/0119233 A1 | 4/2020 | Dupont |
| 2020/0152113 A1 | 5/2020 | Hugon et al. |
| 2020/0161285 A1 | 5/2020 | Tan et al. |
| 2020/0161520 A1 | 5/2020 | Hugon et al. |
| 2020/0300422 A1 | 9/2020 | Tan et al. |

OTHER PUBLICATIONS

International application No. PCT/CA2021/051123 Search Strategy dated Dec. 8, 2021.
International application No. PCT/CA2021/051123 Written Opinion of the International Searching Authority dated Dec. 8, 2021.
U.S. Appl. No. 16/675,445 Office Action dated Mar. 27, 2020.
Sekiguchi et al., Emission color control from blue to red with nanocolumn diameter of InGaN/GaN nanocolumn arrays grown on same substrate, Applied Physics Letters, 96, 231104 (2010).

* cited by examiner

MONOLITHIC NANOCOLUMN STRUCTURES

CROSS-REFERENCE TO RELATED APPLICATIONS

The present application is continuation of U.S. patent application Ser. No. 16/953,919, filed Nov. 20, 2020 that is a divisional patent application of U.S. patent application Ser. No. 17/007,919 filed Aug. 31, 2020, now U.S. Pat. No. 11,094,846, the contents of which are hereby incorporated by reference.

TECHNICAL FIELD

This patent application relates to display technology and illumination devices using active semiconductors emitters.

BACKGROUND

Display technology is undergoing rapid development and evolution. Micro Light Emitting Diodes (micro LEDs) are being used for emerging future generation displays though difficulties remain. Color spectrum only partially covers the CIE color gamut while at the same time throughput in assembly using Mass Transfer methods remains a substantial challenge.

The field of display technology currently uses LED-backlit liquid crystal shutters (LCD) to form images for human visual sensing. Organic Light Emitting Diodes (OLEDs) are also being applied for newer products. The present art is being extended using micro Light Emitting Diodes (micro LEDs) with significant challenges remaining. These are the limited visual spectrum and severe difficulties in assembly of the display. The assembly of displays using micro LEDs require a new technology called Mass Transfer, the automatic positioning of millions of micro LEDs with very high precision, to form pixels and then a display. All at a very high speed to make the display cost effective. So far this has not been achieved.

A review of the scientific journals and patents reveals several efforts in fabricating light emitters from nanostructures, also referred to as nanowires (NW) and nanocolumns (NC).

A most promising feature of NC emitters is that the wavelength of emission has been found to depend on the diameter of the NC without requiring a change in material. With LED materials, different colors require a change of material such that a display having different colors requires assembly of elements coming from different substrates, namely one substrate for each color of LED. The complexity of this assembly is a problem. With NC technology, the same semiconductor substrate can provide pixels of different colors. NC technology also promised to provide a source of illumination that can be monochromatic or multichromatic.

U.S. Patent Publication 2003/0168964 describes light emitting nanowires with an organic active region, filling of intra-nanowire empty regions and forming p-contacts. This application does not describe how to form a display from light emitting nanowires or any description on the Quantum Well (QW) structures and crystal axis orientation. Further it shows limited range of wavelengths on the same wafer. This disclosure is limited to blue light.

U.S. Pat. No. 10,177,195 and U.S. Patent Publication 2019/0131345 show fabrication of a display using nanowires formed using metal organic chemical vapor deposition (MOCVD). The color produced by a nanowire or grouping of nanowires is controlled by changing the diameter of the nanowire. The applications show different materials are used for the active region, requiring different sets of colors to be fabricated on different wafers and then lifted off and mounted on a backplane. This requires Mass Transfer technology on a level that has not been achieved yet. The applications do not disclose forming electrical contacts.

U.S. Pat. No. 10,263,149 discloses nanowires grown using MOCVD and epitaxy assisted by a catalyst. The patent does not describe means of controlling the diameter of a nanowire, and thus further fails to describe controlling the color of light emitted by the nanowire. This application does not describe how to form a display from the nanowires.

U.S. Patent Publication 2017/0279017 describes fabrication of nanowires but does not describe integrated monolithic pixels of different colors disposed on the same wafer. Furthermore, this application marries phosphorous technology with nanowires similar to the way blue LEDs use phosphor for White Light.

U.S. Patent Publication 2018/0374988 describes a method of fabricating nanowires using InGaN for the active region. The diameter of the fabricated nanowires dictates the color. Electron-beam lithography is used to control the diameters of the fabricated nanowires. The application describes how to electrically drive a single nanowire. It does not disclose how to form a display from nanowires because it considers only a single nanowire.

U.S. Pat. No. 10,263,149 discloses nanowires grown using MOCVD and epitaxy assisted by a catalyst. The patent does not describe means of controlling the diameter of a nanowire, and thus fails to describe controlling the color of light emitted by the nanowire. This application does not describe how to form a display from the nanowires.

Ahmed (US 2019/036306), Hugon (US 2017/0352601 A1), Lu (US 2012/0261686 and Wang (US 2012/0253982) all use MOCVD to grow the nanowires and a core shell structure for the QWs.

The Ahmed application shows how the wavelength of the emitter can be changed by changing the diameter. Two different colors are shown without any mention of the External Quantum Efficiency (EQE) or the color gamut that can be covered.

All of the disclosures use MOCVD for nanowire growth grow the QWs in a core shell structure, this means that the QW are grown on m-plane.

The efficiency of a NC-based display is defined by how much electrical current can be converted to light output in the direction of the viewer. When a QW is grown on the m-plane in a NC, light emission is directed to the sides of the NC. Even when the EQE is good, light output through the ends of the NC is hindered by the emission direction.

Only two disclosure by Zetian Mi and a paper in the journal Applied Physics Letters 231104 (2010) by Sekiguchi show nanowires grown by Molecular Beam Epitaxy (MBE) and only Zetian Mi shows QWs grown in the nanowires and at least three different wavelengths on a single wafer in a single process. However, Zetian Mi does not disclose how a display can be fabricated. These QWs are on c-plane and the larger diameter nanowires are in semipolar plane. C-plane emission promises to have better efficiency of light output through the NC.

Zetian Mi et al. discloses emitters on a wafer of different wavelengths limited in range from 460 nm to 635 nm. This variance being achieved by changing the diameter of the nanowire. This disclosure does not define how the emitted light can exit and be useful. Means of providing the electric connections are disclosed. Thus, the EQE will be limited.

Sekiguchi et al describe a similar wavelength range of the emitters, but with no structure for enhancing the EQE of the device. No electroluminescence (EL) properties are disclosed.

The above summary of prior art suggests that nanowires may have the potential to overcome some or all the shortcomings in current display technologies. However, it is also clear that none of the prior disclosures have attempted to show how to make nanowire emitters suitable for arranging them into subpixels/pixels and to make a complete working display of sufficient emitter efficiency and color quality. Combined, these disclosures provide a description of growing nanowire-based emitters of different wavelengths on the same wafer and in the same process. Except for Zetian Mi, what is not disclosed are the growth conditions and how the change in wavelength occurs.

Additionally, none of the prior art addresses the problem related to light emission optical efficiency as a function of the crystal plane on which the QWs are grown on the GaN crystal.

SUMMARY

Applicant has discovered that using a nanocolumn structure derived from Quantum Wells grown on c-plane and semipolar planes, with a dual-layer p-contact structure, provides enhanced levels of light emission and uniformity, such that it becomes possible to build a display with this technology. As detailed herein, the nanocolumn structures found in the prior art may not be suitable to build a display as they typically do not produce sufficient intensities, luminosity, contrast, resolution, etc. The displays using nanocolumns as described herein overcome the shortcomings of displays which would use the prior art nanocolumns.

The array of gallium-nitride (GaN) nanocolumns may have quantum wells in a polar c-plane or in a semi-polar plane to emit light directed to ends of the nanocolumns and an interstitial filler material arranged to cause light emitted in the nanocolumns being guided to exit from an end of the nanocolumns. The sides of the nanocolumns can be coated with a material to reflect light along the lengthwise axis of the nanocolumns. The p-doped ends of the nanocolumns can be metallized and provided with a reflective contact to direct the light out through the n-doped ends.

BRIEF DESCRIPTION OF THE DRAWINGS

The invention will be better understood by way of the following detailed description of embodiments of the invention with reference to the appended drawings, in which.

DETAILED DESCRIPTION

Figure 1:
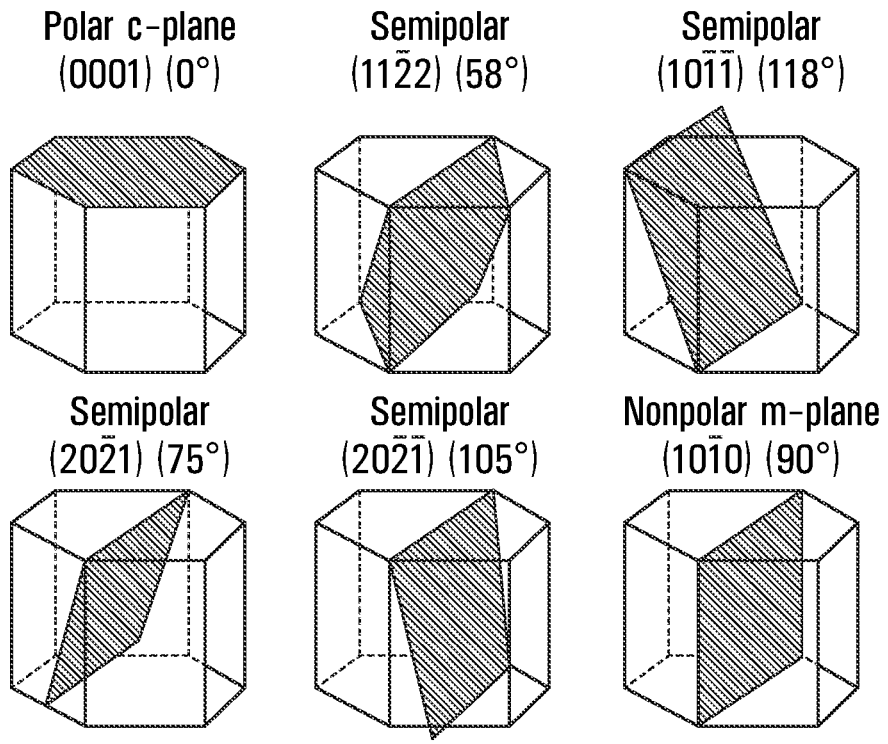
FIG. 1 is an illustration of the Gallium Nitride crystalline planes.

The present disclosure relates to displays comprising nanocolumns and methods of manufacturing nanocolumn-based displays. Such displays may be used in smartphones, wearable devices, micro-displays, graphic displays, televisions, and other devices. For clarity, the term nanocolumn (NC) is used in throughout the present disclosure.

Basic Properties of Displays

A display is usually a two-dimensional arrangement of pixels that in turn are made of subpixels. Displays may have a single subpixel per pixel or a plurality of subpixels to a pixel. The pixels are usually arranged in a two-dimensional matrix where every subpixel has a variable emission level that can be set externally. The important attributes that a display requires are resolution, range of colors (color gamut), range of intensity (contrast), the field of view and the speed at which pixels can change. The uniformity in colors and intensity is especially critical in manufacturing useful displays.

Properties of the Human Eye

The manner light emitted by a display is perceived by a human viewer is dependent on properties of the human eye. The human eye has three different types of cones, each type sensitive to different band of wavelengths that are known to be centered on certain wavelengths. The precise center of the wavelengths varies within the human population but are generally in the following bands: for blue 400 to 500 nm, for green 500 to 600 nm and for red 520 to 680 nm.

Color perception is also influenced by the response of the rods which provide a larger dynamic range but only grey scale perception. The eye perceives color in a very complex way that also involves the processing of color by the human brain. As is well known in the art, most wavelengths of light activate multiple types of cones. The only exceptions are wavelengths below approximately 415 nm, which activate only blue cones, and wavelengths above approximately 680 nm, which only activate red cones. The whole range of colors that are possible is created by the brain from the information available from the three cones (red, green and blue) in the human eye and the ratios of the different intensities. However, present semiconductor technology cannot produce a correct green.

The blue cones are the most sensitive but comprise only 2% of all cones, green cones comprise 65% of all cones and red cones comprise the remaining approximately 33% of all cones. The three types of cones have different responses to the same level of intensity/luminosity of light. In other words, light of a given luminosity will induce different responses from the collective green cones, the collective red cones, and the collective blue cones in an eye. As can be appreciated, the color red is perceived by the brain when there is some stimulation of the red cones with no stimulation of the green cones. The varying amounts of stimulation of the cones allows the visual cortex to perceive what the wavelength of the light is, namely its color. The visual cortex also receives signals from the rods in the retina that provide additional brightness information.

Table 1 below shows the relative response of the cones, compared to the response of the green cones. As shown in Table 1, the luminosity of the three sources is the inverse of the sensitivity. Thus, if the luminosity of green is 1 mW, red luminosity will be 1.33 mW and blue will be 3.85 mW.

TABLE 1

Power per RGB emitter needed to match full spectrum and white light

| Cone | Relative Response | Required Luminosity of Source for Green = 1 mW |
|---|---|---|
| Blue | 0.26 | 3.85 mW |
| Red | 0.75 | 1.33 mW |
| Green | 1 | 1.0 W |

In a display, light may be emitted in pixels, as described above. Each pixel may include one or more subpixels, and each subpixel may emit light at a particular wavelength. The light emitted by the subpixels may act together to activate red, green, and/or blue cones in the eye to varying degrees. In general, visible light acts in an additive manner, such that the intensity of a first subpixel is added to the intensity of a second subpixel. The brain may then process the overall cone activation to produce a perceived color. The present disclosure uses the properties of the eyes described above in combination with properties of nanocolumns to design and fabricate displays.

Prior Art-Gallium Nitride Crystal Planes

Gallium Nitride (GaN), a III-V compound semiconductor, is a wurtzite (hexagonal) crystal. It has the planes as shown in FIG. 1. The m-plane is parallel to the vertical axis, the c-plane is orthogonal to the vertical axis and the semipolar plane is slanted from one side of the crystal to the opposite side as shown. As is known in the art and is detailed herein, the different axis of the crystal have different electrical properties that effect the Quantum Efficiency of the QWs grown on them.

Prior Art-Core Shell Quantum Wells (m-Plane)

Figure 2:
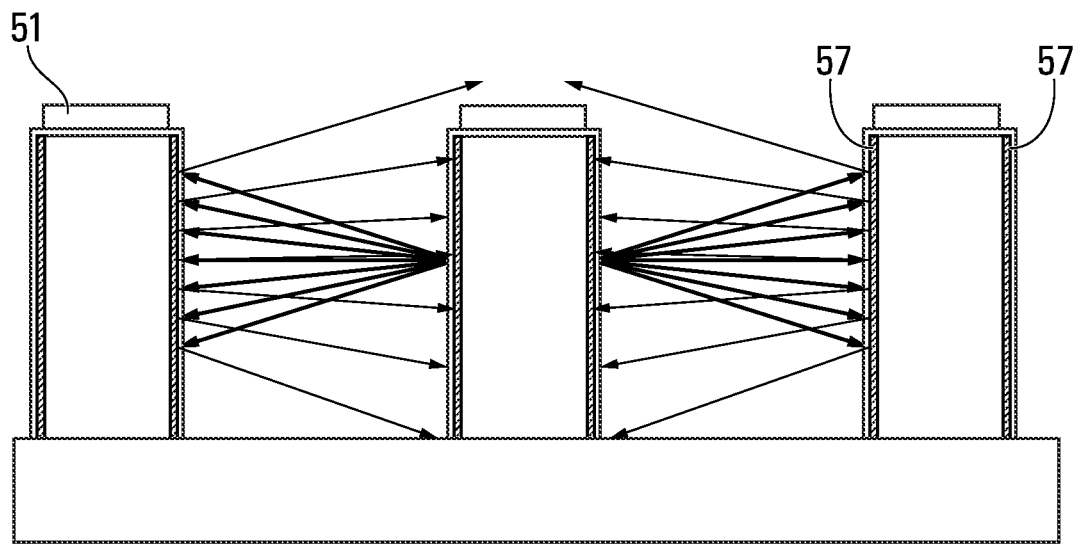
FIG. 2 is an exemplary prior art nanocolumn in which most of the light is emitted transversally.

As described herein, the only way the light emitted from nanocolumns can be used for display and illumination application is when the Quantum Wells (QW) are grown on the c-plane and the semipolar plane; not on m-plane. As is well known in the art, the metal organic chemical vapor deposition (MOCVD) process can only grow QW on the en-planes. Therefore, all the prior art using an MOCVD process may not result in satisfactory results for a display application. The most important limitation of MOCVD grown QWs as core shell structures is that a large portion of the light is orthogonal to the longitudinal axis of the nanocolumn. FIG. 2 illustrates such prior art nanocolumns grown on the m-plane and for which the light is absorbed or reflected by neighboring nanocolumns.

In FIG. 2, the p-contacts 51 are generally opaque and therefore further reduce the light that may be transmitted in the axis of the nanocolumns. Additionally, as they are grown on the m-plane, the QWs 57 may only emit light in a limited angular distribution on each side of each nanocolumn. Growing QWs on GaN using the MOCVD process will by nature result in a core shell structure as illustrated in FIG. 2. There is currently no way of obtaining a growth on a plane other than the m-plane when growing QWs on GaN using the MOCVD process.

In such prior art embodiments, most of the light is emitted orthogonal to the vertical axis and gets absorbed or reflected from the next nanocolumn. Only a very small amount of light will exit towards a viewer of the display, and that the light will be scattered to a degree which may prevent coherent display of images. Advantages of MOCVD grown QWs on the m-plane include having a large QW surface area. However, even with an increased surface area (being many factors larger than an equivalent QW structure built on the c-plane), there is close to no useful light being emitted, meaning that the Effective EQE is very low.

Quantum Wells on c-Plane and Semipolar Plane

In the prior art references teaching QWs grown on c-plane and semipolar plane, they do not show these planes to have any advantages over Core shell and do not show the Effective External Quantum Efficiency ($E^2QE$) differences. Furthermore, the prior art references do not show how subpixels and pixels can be formed to construct a chromatic display.

Molecular Beam Epitaxy (MBE) grown QWs on the c-plane or the semipolar plane allows for the light emission to exit vertically along the longitudinal axis of the nanocolumn, which incidentally is directed towards the viewer. By providing means to enhance the light extraction, most of the light will be useful, giving a very high $E^2QE$.

Figure 3:
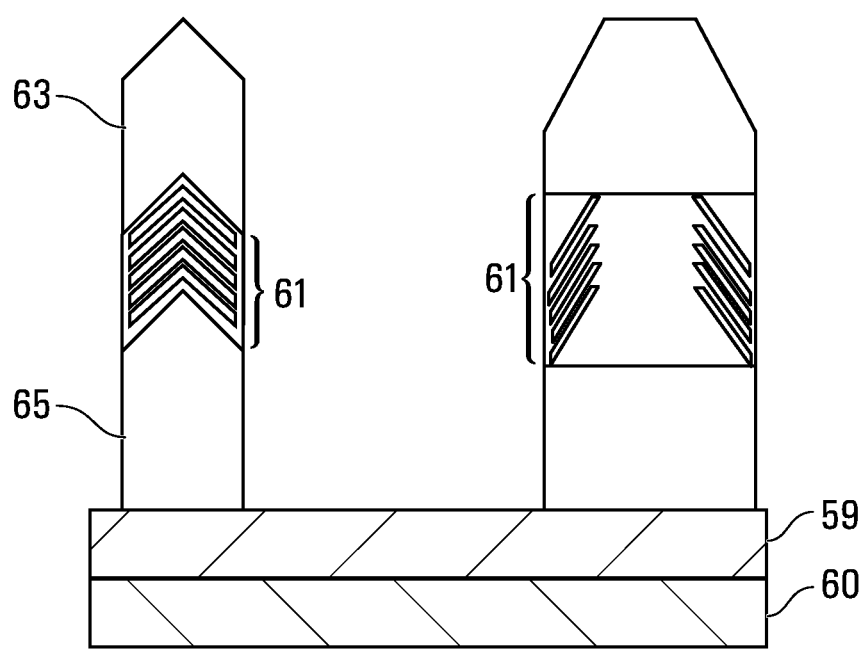
FIG. 3 is an exemplary nanocolumn in accordance with the present disclosure.

FIG. 3 is a schematic illustration of one such nanocolumn with QWs grown on the c-plane or the semipolar plane through an MBE process. A natural part of the MBE process is that QWs grown on the c-plane and semipolar plane depends on the diameter of the nanocolumn. For example, when the diameter (or the cross-sectional area) is small, the QW may be formed on the m-plane, while when the diameter is larger, the QW can form on the m-plane. It is then well understood that c-plane and semipolar plane are the only method by which QWs can be grown on nanocolumns and provide means of forming displays. Referring to FIG. 3, the nanocolumns may have a buffer layer 59 that may act as a common electrode (e.g., an n-GaN layer) and which is on top of a structural substrate 60 which may be necessary for the growth process of the nanocolumns. Each nanocolumn may be grown such that there is a n-GaN layer 65 in contact with the buffer layer 59. The active region comprising the QWs 61 may thereafter be grown on top of the n-GaN layer 65. The nanocolumns may further include a p-GaN layer 63 which may be electrically powered through separate electrodes.

Figure 4:
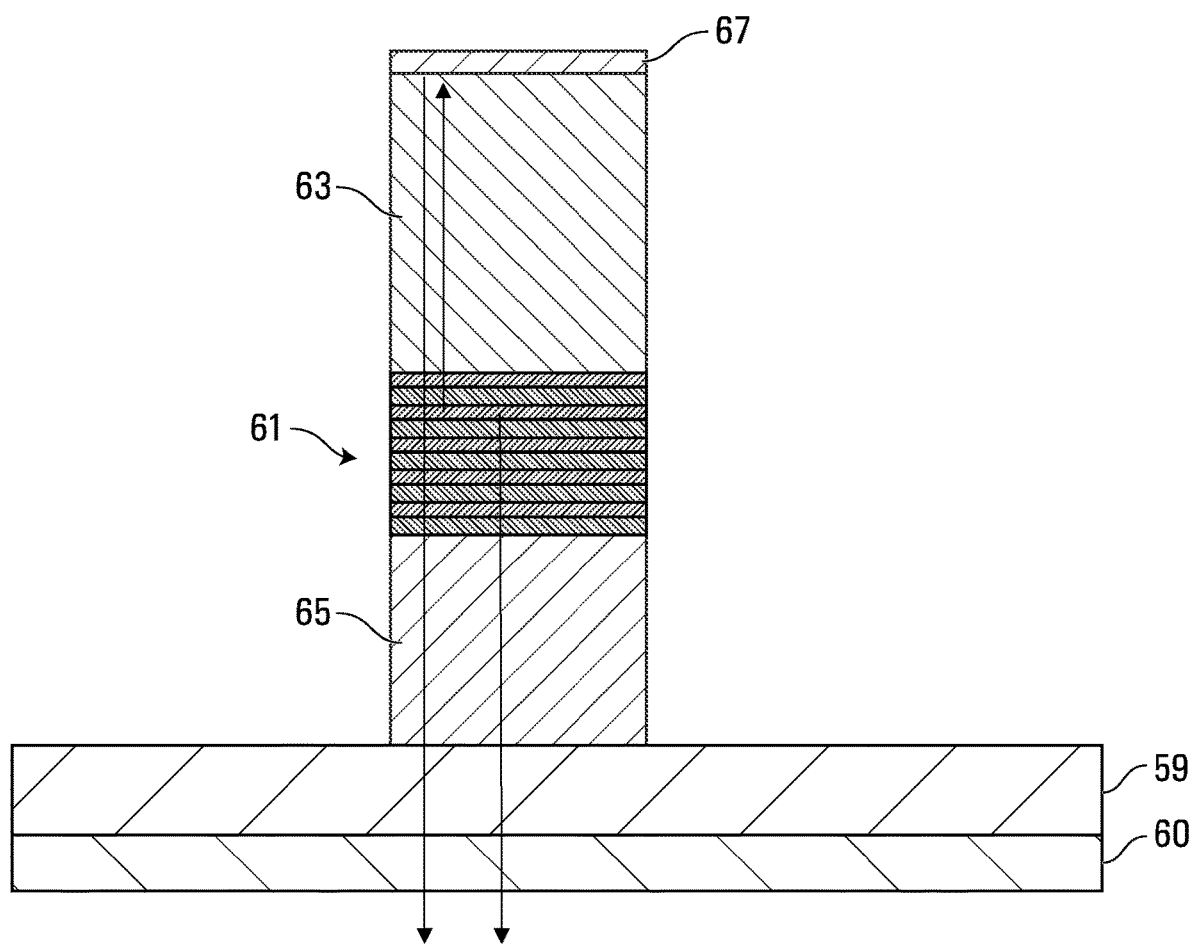
FIG. 4 is a schematic of an exemplary nanocolumn in accordance with the present disclosure in which the emitted light is illustrated.

While FIG. 3 illustrates a nanocolumn structure during the production process, FIG. 4 provides a more detailed nanocolumn structure view for a single nanocolumn once the production process is completed (i.e., complete structure without inter-nanocolumn filler material). As such, it may be observed that the growth substrate 60 has been removed and that the buffer layer 59 acting as the common electrode is the layer through which the light emissions exit the nanocolumn. To help visualize the light emissions, light rays are shown. Although the buffer layer 59 is illustrated in FIG. 4 as being on the single nanocolumn, this is a schematic illustration of a single column and it will be understood that the layer of n-doped GaN 59 will span all of the nanocolumns.

As the nanocolumn illustrated in FIG. 4 may be used in a display or an illumination panel, a back panel 69, comprising the necessary connections to each subpixels and electrical driver circuitry, may be connected to a conductive p-contact layer 67 that may also act as a reflector. The p-contact layer 67 may thus act as both the electrical connection between the p-GaN layer 63 and the back panel 69 and as a reflector to reflect the light emitted by the QWs 61 towards the side opposite of where the viewer would be. As such, there may be a significant increase in light transmission. As will be described below, the layer 67 can be a complex layer that provides a good conductive contact with the p-doped GaN whose bandgap energy makes it difficult to establish an electrical connection. This portion of the complex layer may be transmissive (i.e., only slightly absorbing). Although contact layer 67 is illustrated in FIG. 4 as being on the single nanocolumn, this is a schematic illustration of a single nanocolumn and it will be understood that the layer 67 will span all of the nanocolumns in a given pixel or subpixel.

Figure 6:
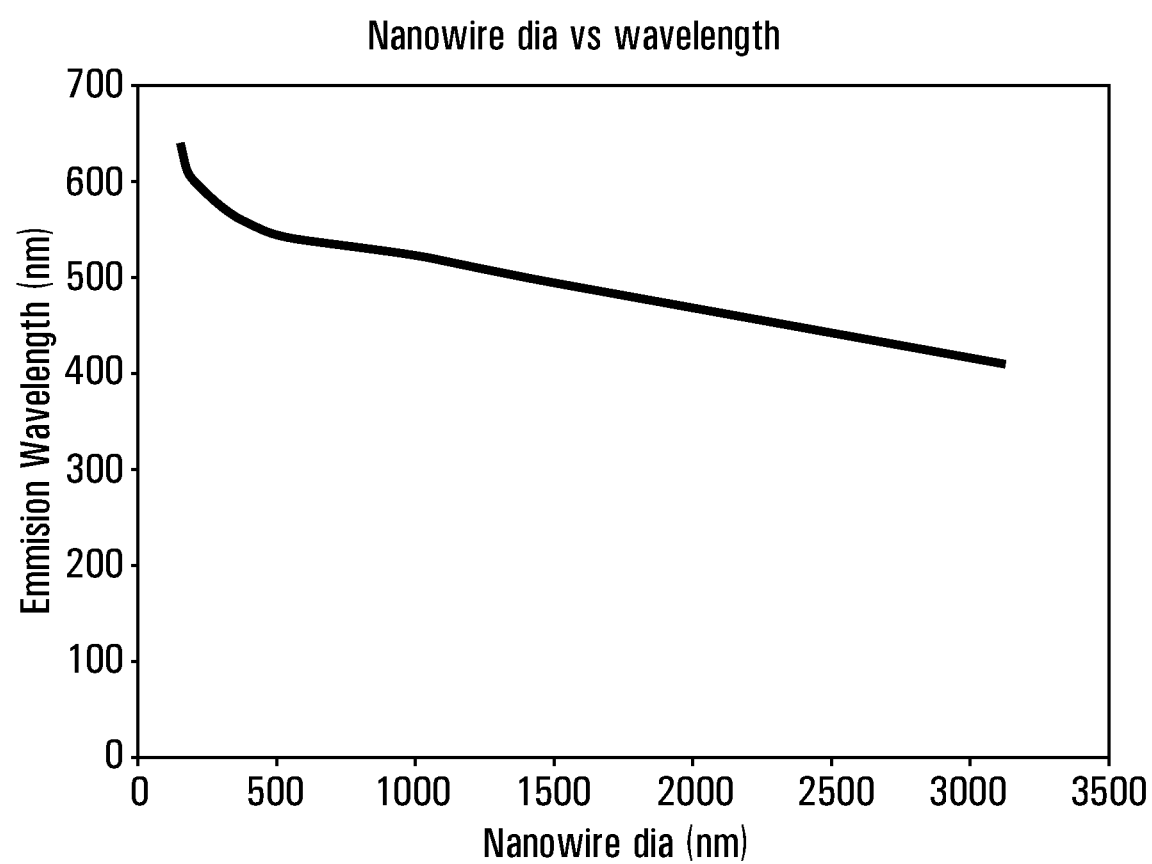
FIG. 6 is a graph illustrating the relationship between the diameter of a nanocolumn and the wavelength of light emitted by the nanocolumn.

As described herein, the diameter of the nanocolumns affect the wavelength of its emitted photons. FIG. 6 shows a graph of the relation between diameter and wavelength. As it may be seen on the graph, the larger the diameter, the lowest the produced wavelength will be. Since it is possible to control the diameter of the nanocolumn being grown through the MBE process, it is possible to control the color of the light emitted. Therefore, creating pixels and subpixels with the exact desired distribution of nanocolumns for each wavelength may be done.

Preferred Embodiment

Monolith single process chromatic emission substrate.

The present disclosure relates to methods of fabricating monolithic light emitters from III-V compound semiconductors using selective area growth (SAG) of the nanocolumns, a plurality of QWs and, described in detail below, with another III-V structure on top and a p-contact. A plurality of these nanocolumns can then form a subpixel. One or more of these subpixels groups then form a pixel. For RGB subpixels these would be three in number, although it may be possible using the present technology to make use of more than three wavelengths. It is also possible to select the desired wavelengths and the number of nanocolumns dedicated to each wavelength to improve the color gamut and efficiency of the display.

The process begins with providing a process substrate, for example a sheet of sapphire or silicon. A buffer layer of negatively-doped GaN is deposited on one side of this process substrate. This buffer layer 59 will eventually become the display's emission window and common contact for the nanocolumns. A metal layer of 2-μm Mo can be deposited on the back surface of the Sapphire (or silicon) substrate for a uniform and efficient heat transfer from the heater to the process substrate. A thin Ti layer (~10 nm) is first employed as the growth mask on the buffer layer 59 for the selective area epitaxy of GaN nanocolumns. Nanoscale hexagonal apertures, with a certain lateral size "d" arranged in, for example, a triangle lattice of a lattice constant "a" can be fabricated using, for example, e-beam lithography and reactive ion etching. Prior to the growth of nanocolumns, nitridation of the Ti mask can be performed at about 400° C. to prevent crack and degradation during the growth process. Then, n-GaN (500 nm) and p-GaN (270 nm) nanocolumn segments can be respectively grown with a substrate temperature of about 980° C. and 960° C., with, for example, a nitrogen flow rate of about 0.6 sccm, and Ga flux of ~2.5×10−7 Torr in a MBE system. Several pairs of InxGa1-xN (~3 nm)/GaN (~3 nm) can be sandwiched between n- and p-GaN segments as the multiple QWs active region. The growth conditions of the active region may consist of a substrate temperature of about 735° C., a nitrogen flow rate of about 1.2 sccm, Ga and In beam fluxes can be of ~1.8×10-8 Torr and ~9.0×10-8 Torr respectively. Si and Mg can be used as the n- and p-dopants, respectively. The substrate temperature mentioned here refers to the thermocouple reading on the backside of the process substrate. The real substrate surface temperature is estimated approximately ~100-150° C. lower, depending on the substrate and sample size. When the nanocolumns have been grown to the desired height, the residual Ti mask can be removed by a cleaning process.

Figure 7:
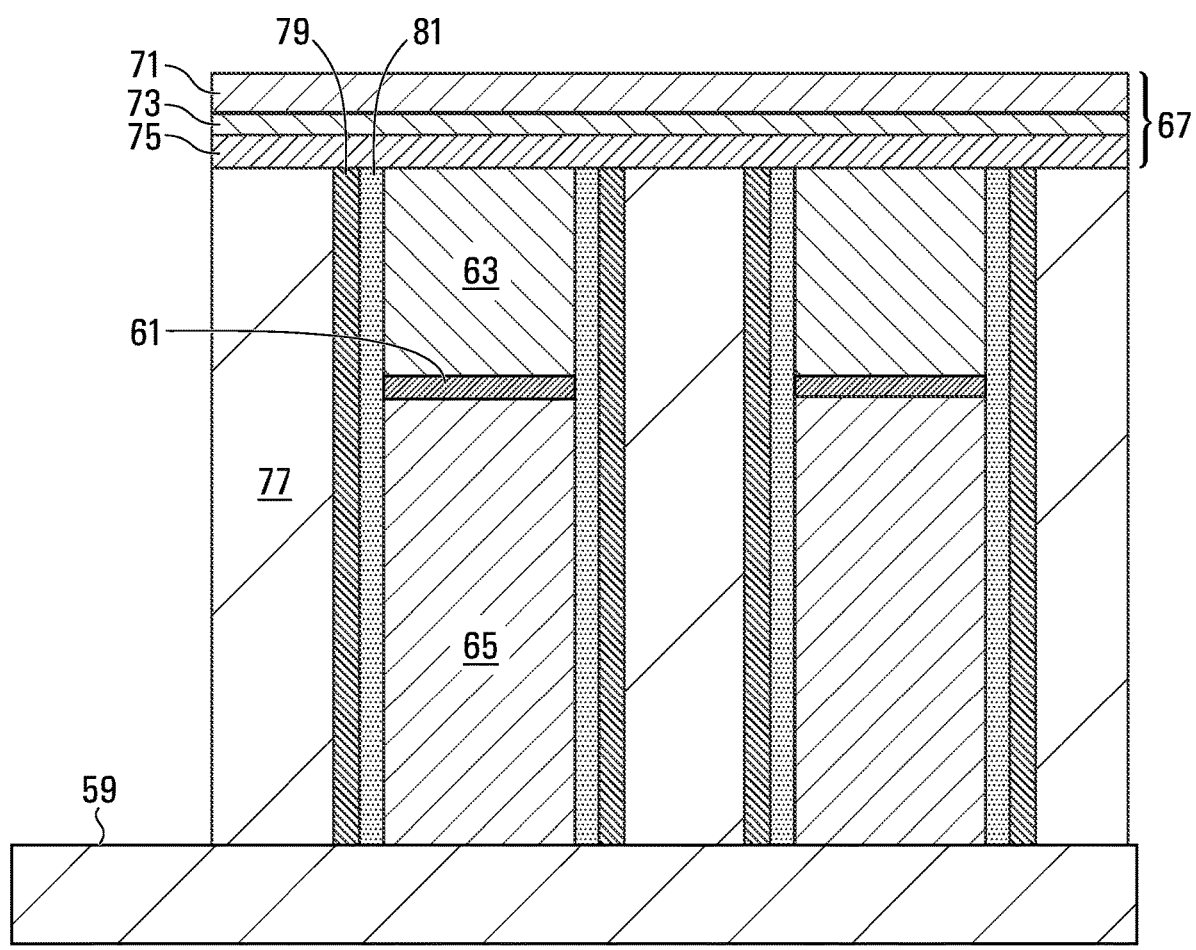
FIG. 7 is a schematic of an exemplary nanocolumn in accordance with the present disclosure illustrating the structure of two nanocolumns and the surrounding layers.

FIG. 7 illustrates the resulting structure of this preferred embodiment, including the inter-nanocolumn layers which may be added after the completion of the growth of the nanocolumns, as described herein. In this embodiment, the n-contact may be made through the buffer layer 59, which may be an n-GaN layer. The nanocolumn n-GaN layer 65 is grown on this buffer layer 59 and the QWs 61 are further grown on top of the n-GaN layer 65. A p-GaN layer 63 may then be added on top of the active layer 61. The p-contact complex layer 67 may provide the necessary electrical connection for the p-GaN layer while enhancing the emitted light intensity by reflecting the light that would otherwise not exit the nanocolumn as it originally is emitted towards the side opposite to the exit.

In the preferred embodiment, the p-contact complex layer 67 may comprise a number of layers, such as an Ni layer 75, a Au layer 73 and a reflective metal layer 71. For light transmission, metallization interface layers 75 and 73 bond to the p-GaN to allow for current to conduct between the p-GaN to the metal conductor 71. The material thickness of the p-contact interface layers matters. The thicker the Ni/Au layers are, the more the absorption and loss of light. The preferred embodiment may use 3 nm of each metal for deposition of the p-contact. Other metals for the metallization layer, such as Pd, may also be used. The two metals form a complex where the Ni/Au fuses with the p-GaN at the right temperature. Below the thickness of about 3 nm each, this fusion with the p-GaN may not happen and the Ni/Au may not survive probing and peel off. However, it may be optimal for the layers to remain at about 3 nm each, such that the light emitted towards that side of the display (i.e., opposite of the exit towards a viewer) may pass through and be reflected on a reflective and conductive layer 71 added over the Au layer 73. With a total Ni/Au layer thickness of about 6 nm, there may be less than about 10% loss for light going through the layer and back (i.e., most of the light emitted towards the reflector is reflected back to the exit of the nanocolumn).

There may be a number of layers between each nanocolumns in order to enhance light transmission and ensure electrical insulation, such that the nanocolumns emitting light may be limited to the ones desired (i.e., controlled through the specific electrode being powered and not induced by neighboring powered nanocolumns). Therefore, each nanocolumn may be first surrounded by a transparent insulation layer 81. A reflector layer 79 may be added on the outside of the isolation layer 81, such that the reflector layer 79 may reflect light emitted towards the side of the nanocolumn back to the nanocolumn. The reflector layer 79 may thus increase the light being propagated towards the exit of the nanocolumn, such that more photons may reach a viewer.

The insulation layer 81 may comprise $SiO_2$ and the reflective layer 79 may comprise aluminum (Al) or a suitable dielectric material that is reflective across the visible spectrum or at least for the wavelength of emission of the nanocolumn. Finally, an opaque absorbent inter-nanocolumn filler 77 may be added, such that there may be no light transmission between the nanocolumn or external light reflected from the interstitial space between the nanocolumns. The filler material 77 may be polyimide, with the option of adding graphite or other pigment to improve light absorption, for example to give an absorption coefficient greater than about 0.8 for white light. The filler material can thus have the property of absorption of light, both remnant of emission that escapes the reflective coating and light incident from ambient on the surface.

Device Formation

Figure 5:
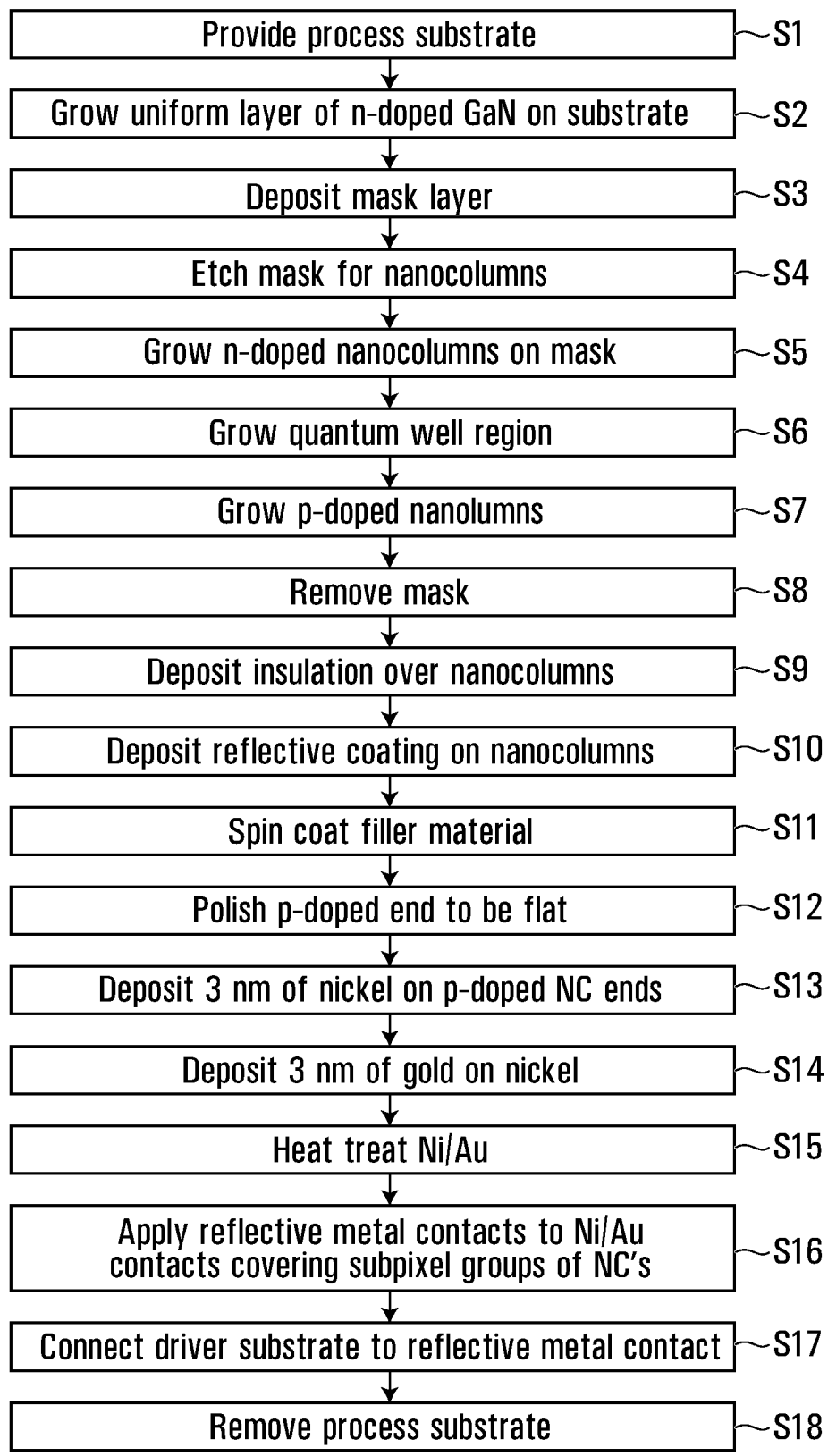
FIG. 5 is a flow chart illustrating steps involved in the manufacture of a monolithic nanocolumn emitter panel.

From a semiconductor-based structure of nanocolumns to make each nanocolumn a device that functions on application of electric current and then to enhance the light extraction in a manner suited for displays can involve the steps described below and form part of the preferred embodiments. Someone skilled in the art will appreciate that variations in the steps presented herein may be done without departing from the teachings of this disclosure. The different steps of producing a display or a lighting source are set out in the flow chart of FIG. 5 and the monolithic device in the corresponding stages of manufacture is illustrated at FIGS. 8A through 8H.

Figure 8A:
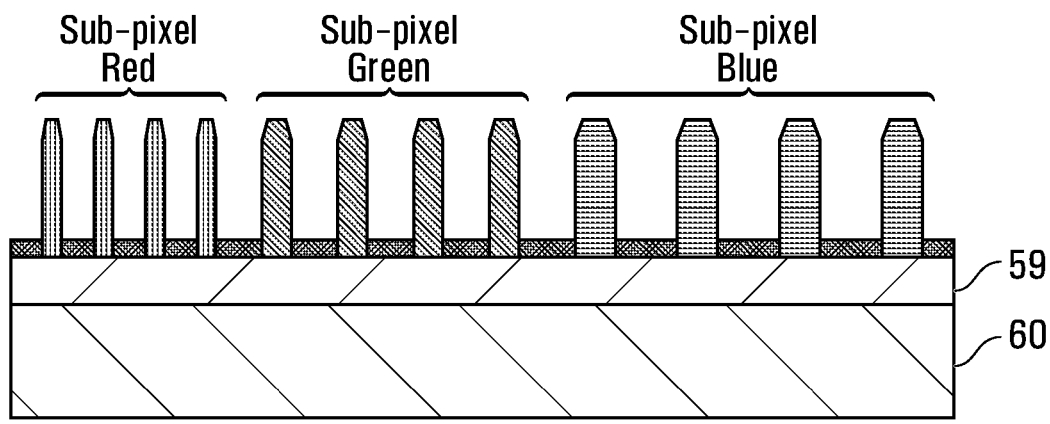
FIG. 8A-8H are schematic representations of the steps of manufacturing a nanocolumn display device according to the present disclosure.

In step S1 the support substrate is provided. In step S2, a uniform layer of negatively-doped GaN is grown on the support substrate. As shown in FIG. 8A, a number of nanocolumns are first grown on a buffer layer 59 resting on a structural substrate 60. The substrate 60 may be silicon (Si), Sapphire, or bulk GaN with a buffer epitaxial layer. A thin layer of masking material may be deposited onto the substrate (step S3) which is etched (step S4) to be employed as the growth mask for the selective area epitaxy of GaN nanocolumns. The masking material can be any hard material as the epitaxial growth may require higher temperatures (e.g., it may be titanium (Ti)).

Figure 8B:
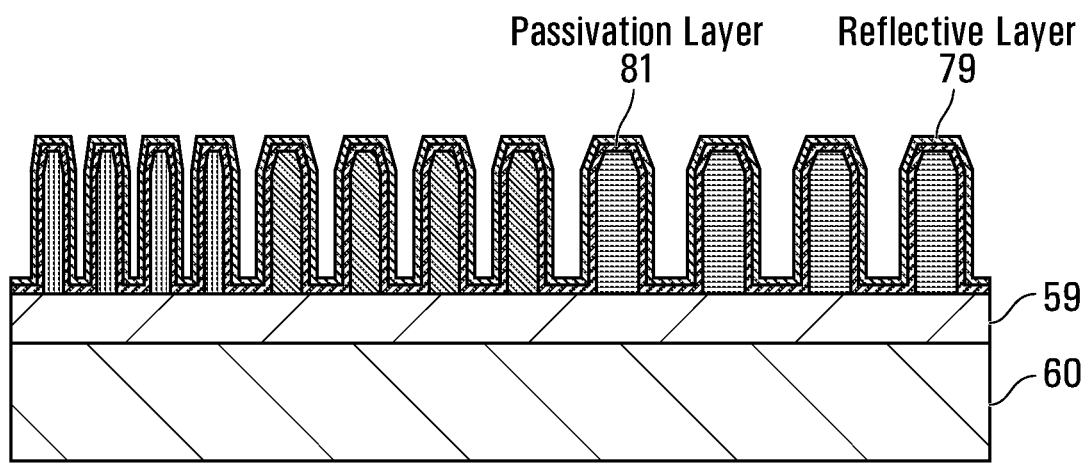
Figure 8C:
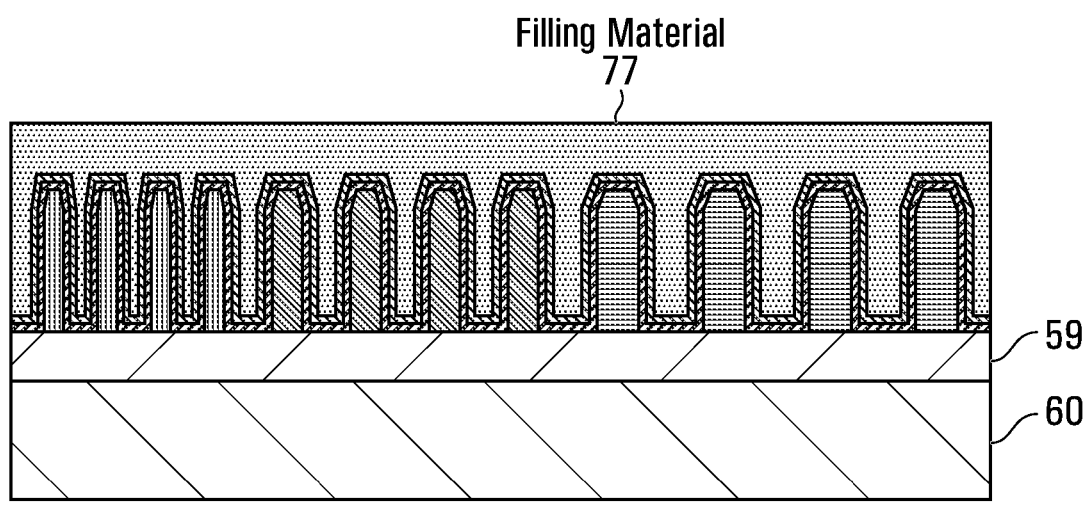

The nanocolumns are grown (step S5), as described herein, using an MBE process. The quantum wells (QW) are grown on the n-doped GaN nanocolumns (step S6) and then p-doped GaN is grown on the QW regions to continue growing the nanocolumns (step S7). Once the nanocolumns are completed (i.e., the p-GaN layer is grown), the masking material can be removed and the nanocolumns may be coated with a passivation layer of SiO$_2$ (step S9), as shown in FIG. 8B. The passivation layer 81 may then be coated a metallic reflective layer 79 (step S10), which may be aluminum (Al) or an electrically insulating dielectric. The reflective layer 79 and passivation layer 81 may be done through a sputtering process. FIG. 8C illustrates the following step, in which a light absorbing material 77 may be deposited in the areas between and over the nanocolumns (step S11).

The filler absorbing material 77 may be deposited using any suitable deposition process as is known in the art, for example by spin coating and baking.

Planarization

Figure 8D:
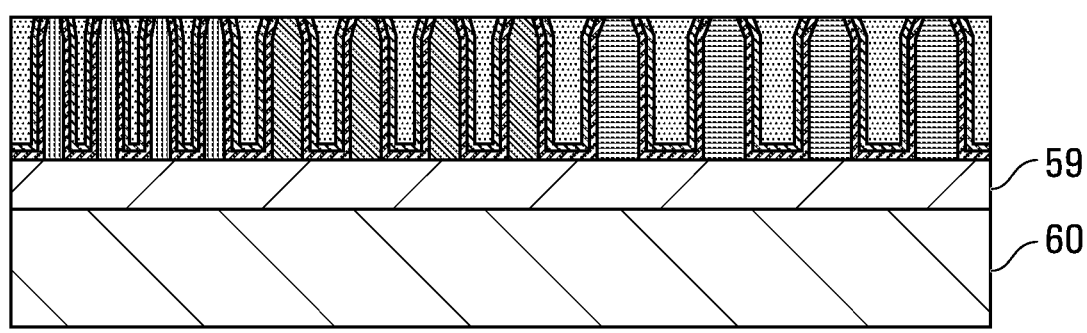

As shown in FIG. 8D, the wafer is then polished using a Chemical Mechanical Polishing/Planarization (CMP) process (step S12) to expose the top of the nanocolumns. The p-GaN layer on the top of the nanocolumns may thereafter become available for further processing.

P-Contacts

Figure 8E:
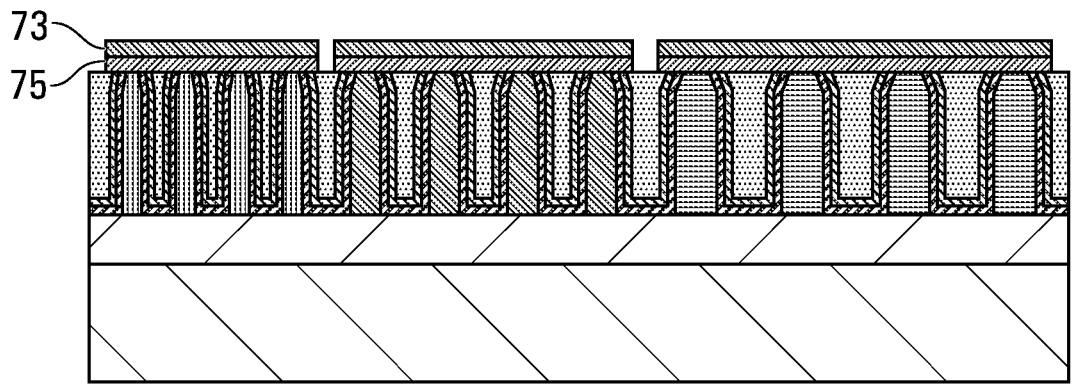

Now referring to FIG. 8E, a thin layer, which may be of about 3 nm thick, of Ni (layer 75, step S13) and then Au (layer 73, step S14) may be deposited on the exposed top of the nanocolumns. The Ni/Au layers may subsequently be annealed (step S15). As described herein, this forms a p-contact which is highly transparent to visible light, and the metal interface layer of Ni/Au absorbs less than about 10% of the light round trip. Metal reflective contacts covering a pixel or subpixel group of nanocolumns are deposited, for example by depositing a uniform layer and etching separations between the individual contacts (step S16). As shown in FIG. 8E, each subpixel may be connected to the same layer of Ni/Au 75, and metal reflective contact 73 such that the whole subpixel may emit light at the same time when powered. As described herein, each subpixel is formed of multiple nanocolumns emitting light at the same or similar wavelengths. This may be required as a single nanocolumn may not emit enough light to present sufficient characteristics for a functioning display (i.e., there is a need for multiple red nanocolumns emitting light at the same time to provide sufficient red light for a single pixel).

Figure 8F:
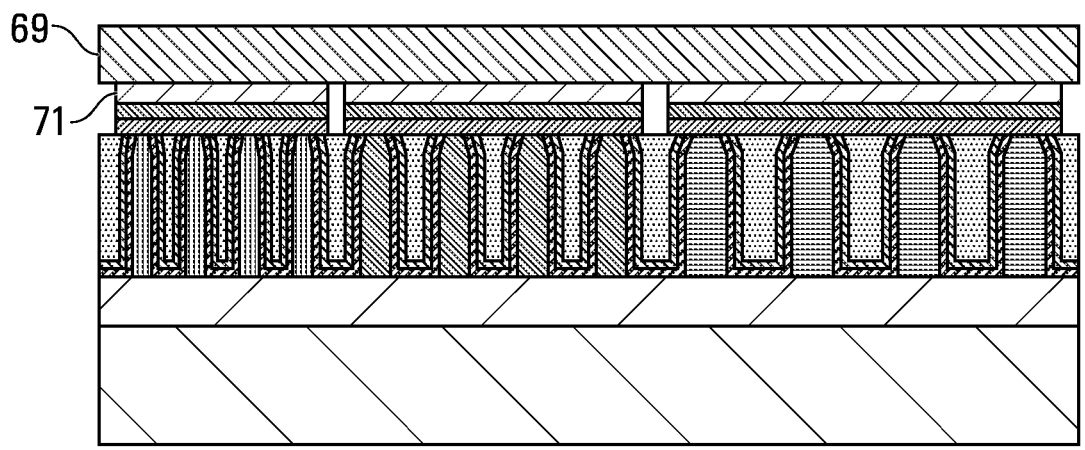

The Ni/Au layers 75, 73 may be annealed at 450° C. for 10 minutes to produce the desired p-contacts. To complete the device structure and provide the path for electrical current to individual subpixels of the display, a reflective and conductive layer 71 may be deposited for the positive electrodes, as shown in FIG. 8F. All the p-contact of subpixels in a pixel are connected and routed to match the pattern on a silicon backplane 69 with the drive electronics (step S17). This silicon backplane 69 is not part of this disclosure but is well known in the art, and in the case of a lighting panel, all subpixels can be driven in a like manner, while in a display, individual pixels are addressed and driven. The reflective and conductive layer 71 may reflect the light coming out of the top of the nanocolumn back into the nanocolumn.

Figure 8G:
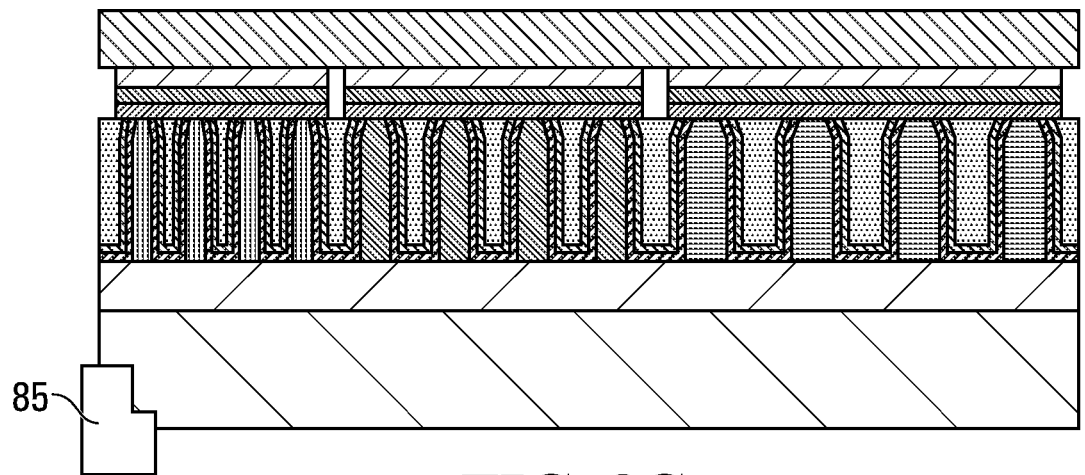

As illustrated in FIG. 8G, the Sapphire substrate layer 60 may then be removed from the wafer (e.g., liftoff to remove the Sapphire layer, step S18). For the negative electrodes, the n-GaN common layer (i.e., buffer layer 59) at the bottom of the emitting structure of nanocolumns may thereafter be connected to a common source of electrical power source 85. Someone skilled in the art will appreciate that the negative and positive sides of each nanocolumn may be reversed, the same being determined by alternate designs of the Silicon backplane and the nanocolumns.

Figure 8H:
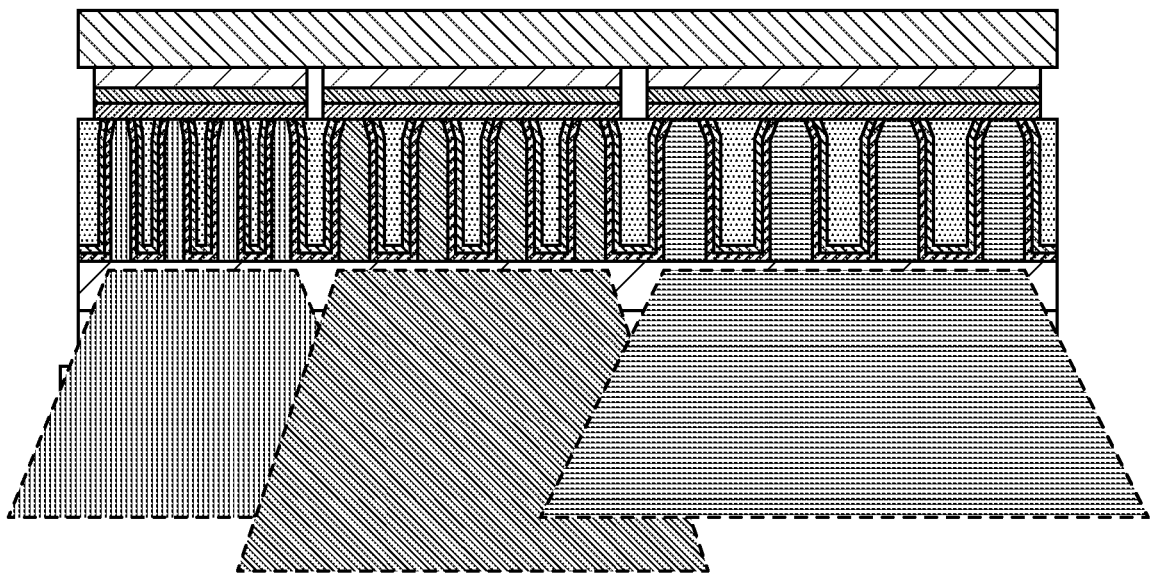

The resulting single piece display, or part thereof, is now complete with the light being emitted so it may be visible to the user of the display, as shown in FIG. 8H.

While the above-described manufacturing process involves growing the nanocolumns on an n-doped buffer layer, it will be understood that one could begin by growing p-doped nanocolumns. In this case, the n-doped top surface of the monolithic device would be polished instead of the p-doped top surface. For the common electrical contact, there would be no n-doped layer spanning the nanocolumns, so a transparent electrode can be deposited over the n-doped side of the device. For the p-doped surface, it would be separated from the support substrate and polished to expose the p-doped ends of the nanocolumns. Metallization and the depositing of the contacts would be the same as described above.

Number of Nanocolumns Per Subpixel

The number of nanocolumns in each subpixel can be determined using the following equation:

$$N_{\lambda x} = P'_{\lambda x}/(P_{nw} \times R_{\lambda x}),$$

wherein $N_{\lambda x}$ is the number of nanocolumns in the subpixel, $P'_{\lambda x}$ is an effective power output by the subpixel, $P_{nw}$ is the maximum power output by a single nanocolumn at $V_{fd}$, and $R_{\lambda x}$ is a relative photometric sensitivity of the human eye to light emitted by the subpixel. The display may comprise three subpixels, configured to emit red light, green light, and blue light, respectively.

In some embodiments, a nanocolumn-based display comprises a plurality of pixels, each pixel comprising five subpixels, each comprising a plurality of nanocolumns, wherein each plurality of nanocolumns is configured to emit light at a particular wavelength, a backplane connected to all of the nanocolumns of the display, a plurality of contacts, each contact connected to the nanocolumns of a single subpixel of a single pixel, wherein each of the five subpixels comprises a different number of nanocolumns. A first of the five subpixels may emit light at about 700 nm, a second of the five subpixels may emit light at about 610 nm, a third of the five subpixels may emit light at about 565 nm, a fourth of the five subpixels may emit light at about 470 nm, and a fifth of the five subpixels may emit light at about 400 nm. Each of the first subpixel and the fifth subpixel may comprise more nanocolumns than the second subpixel, the third subpixel, or the fourth subpixel.

The display may comprise a control system configured to control which of the five subpixels in each of the pixels are activated. This control system may comprise an environmental brightness sensor configured to detect whether a brightness of an environment around the display is above a threshold or below the threshold. The control system may be configured to activate all of the five subpixels when the brightness is below the threshold and to activate only the second subpixel, third subpixel, and fourth subpixel when the brightness is above the threshold.

In some embodiments, a method of fabricating a nanocolumn-based display can comprise determining a number m of subpixels in each pixel of the display, a wavelength $\lambda x$ at which a subpixel x emits light at wavelength $\lambda$, and a maximum operating power $P'_{\lambda x}$ at which subpixel x emits light at wavelength $\lambda$, identifying a power $P_{nw}$ at which nanocolumns emit light at a voltage $V_{fd}$ at which the display operates, and a relative photometric sensitivity $R\lambda$ of the human eye to light of wavelength $\Delta x$ for each $\Delta x$, calculating the number $N_{\lambda x}$ of nanocolumns in each subpixel, wherein calculating comprises solving the following equation: $N_{\lambda x} = P'_{\lambda x}/(P_{nw} \times R_{\lambda x})$, determining a pattern of nanocolumns arranged in pixels, each having m subpixels, wherein the pattern provides $N_{\lambda x}$ nanocolumns per pixel for each wavelength $\lambda x$, and growing nanocolumns on a substrate in the determined pattern.

Figure 9:
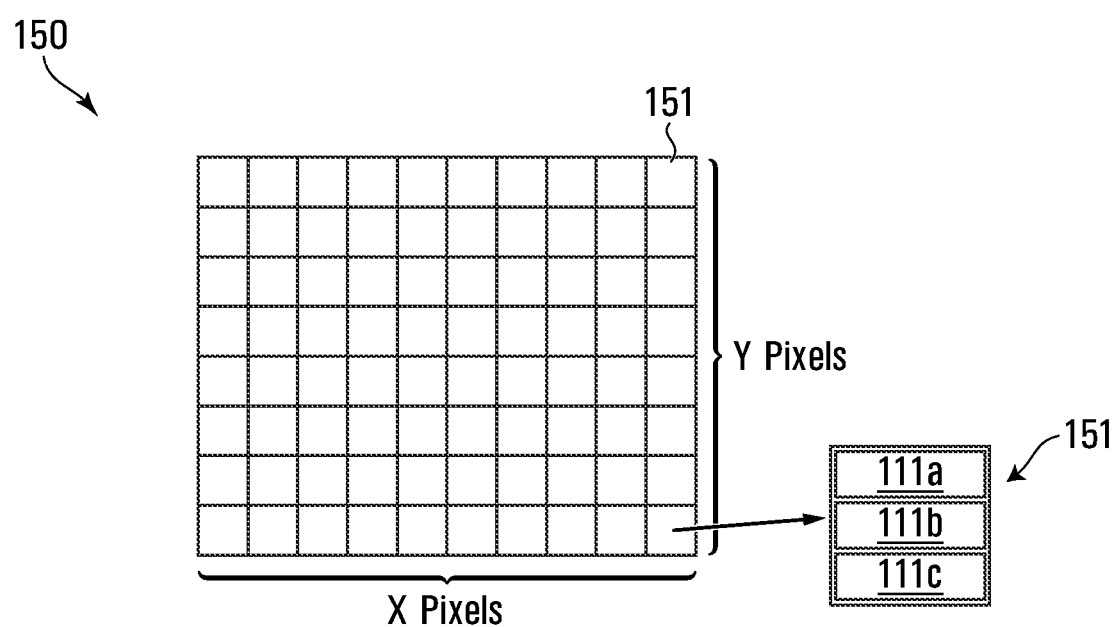
FIG. 9 is a schematic diagram of an exemplary display comprising a number of pixels.

FIG. 9 shows a schematic representation of a nanocolumn-based display 150. As discussed above with respect to FIG. 9, the display 150 may comprise a two-dimensional array of pixels 151. Each pixel 151 may comprise one or more subpixels 111a, 111b, 111c. Each subpixel 111a, 111b, 111c may comprise a group of nanocolumns which emit light at a desired wavelength $\lambda a$, $\lambda b$, $\lambda c$. The total number of nanocolumns in each group may be chosen so that the subpixel 111a, 111b, 111c can emit light at a desired maximum luminosity. The desired total maximum luminosity may be determined by the ambient environment in which the display will be used. The luminosity of the pixel then is simply L/T, where L is the total luminosity of the display and T is the number of pixels in the display.

Designing a display as shown in FIG. 9 may require choosing the values listed below under "Given Values," determining the properties listed below under "Known Values," and calculating the values listed below under "Calculated Values." The Given Values and Known Values may be used to calculate $N_{\lambda 1}$, $N_{\lambda 2}$ ... $N_{\lambda m}$, where m is the number of subpixels in each pixel of the display and $N_{\lambda x}$ is the number of nanocolumns emitting light at wavelength $\lambda x$ which are needed in each subpixel of the display. After determining the number of nanocolumns per subpixel, the size and area of the subpixels can be chosen depending on inter subpixel distances (which may impact the contrast of the display).

Exemplary calculations are provided below.

Example of Nanocolumn-Based Display Design

Figure 10:
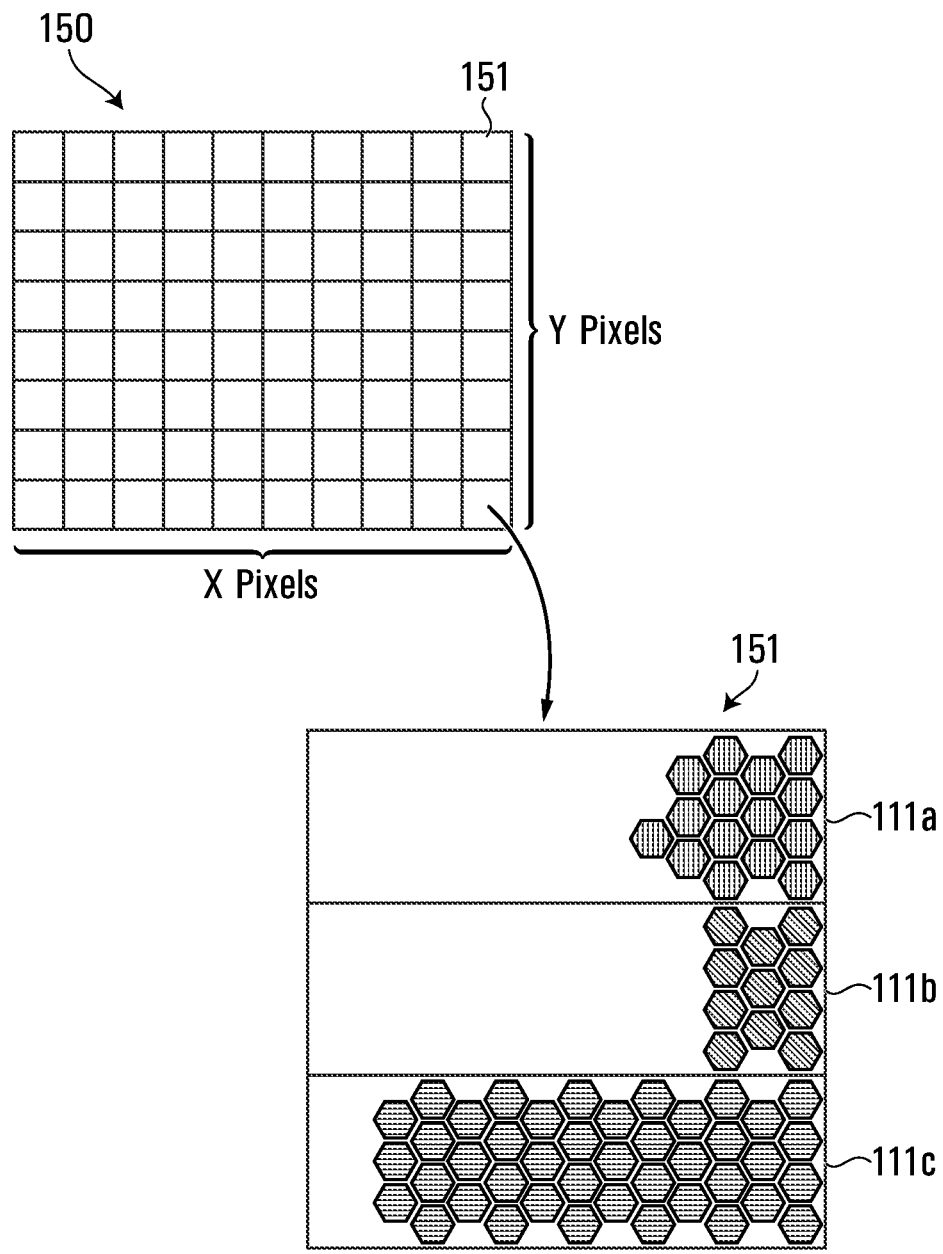
FIG. 10 is a schematic diagram of an exemplary display comprising a number of pixels each having three subpixels.

The first exemplary display is illustrated in FIG. 10 and is similar to standard RGB displays, except for the green being as required for CIE color gamut to be larger. As described above, each pixel 151 of the display 150 includes a red subpixel 111a, a green subpixel 111b, and a blue subpixel 111c. Accordingly, the following values may be chosen and determined for the display 150:

$T = 1,125$ pixels*$2,436$ pixels=$2,740,500$ pixels.

$L = 5,000$ nits=$92$ Watts $m = 3$ subpixels $\lambda_1 = 635$ nanometers (red)

$\lambda_2 = 530$ nanometers (green)

$\lambda_3 = 450$ nanometers (blue)

$L_p = L/T = 92/2,740,500 = 33.5 \times 10^{-6}$ $W = P_p$;

we note here that the luminosity $L_P$ per pixel is equal to the power output $P_P$ per pixel measured in watts. Now we consider the nanocolumns to be operating at maximum operating point, each different wavelength at different $V_{fd}$ and current density. All producing the same amount of power. Therefore, the power desired per subpixel is $P'_{\lambda 1} = P'_{\lambda 2} = P'_{\lambda 3} = 33.5 \times 10^{-6}/3 = 11.1 \times 10^{-6}$ watts.

The power then has to be normalised for the different relative response of the cones of the human eye. $R_{635} = 0.75$; $R_{530} = 1$; $R_{450} = 0.26$. The relative photometric sensitivity of the eye to light at these wavelengths may be based on the properties of the human eye discussed above.

Since, $P_p = P_{nw\lambda 1} + P_{nw\lambda 2} + P_{nw\lambda 3}$, we have $P_{nw\lambda 1} = P_{nw\lambda 2} = P_{nw\lambda 3} = 1 \times 10^{-6}$ W from the measurements.

The number of nanocolumns emitting light at each wavelength needed for each subpixel may thus be calculated as follows:

$N_{635} = (P'635/(Pnw\lambda 1 \times R635)) = (11.1 \times 10^{-6}/(1 \times 10^{-6} \times 0.75)) = 14.8 = 15$ $N_{530} = (P'530/(Pnw\lambda 2 \times R530)) = (11.1 \times 10^{-6}/(1 \times 10^{-6} \times 1)) = 11$ $N_{450} = (P'450/(Pnw\lambda 3 \times R450)) = (11.1 \times 10^{-6}/(1 \times 10^{-6} \times 0.26)) = 42.7 = 43$ Based on the calculations above, each pixel 151 of the display 150 will be designed to include 15 nanocolumns which emit light at 635 nm (red light), 11 nanocolumns which emit light at 530 nm (green light), and 43 nanocolumns which emit light at 450 nm (blue light). Looking at the calculations above, one will note that the greatest variation occurs in the $R_{\lambda x}$ values. Based on those values, it is not surprising that the display requires the most blue nanocolumns and the least green nanocolumns. The expanded pixel 151 in FIG. 10 approximately illustrates the proportion of red nanocolumns, green nanocolumns, and blue nanocolumns based on this calculation.

The display described in this example may be similar to current RGB displays. However, it may also present several advantages over such displays. First, this display may consume less power since nanocolumns need lower voltages than micro LEDs. This may be particularly advantageous for portable devices, such as smartphones and wearable devices, which rely on battery power; this display may thus extend battery life. Second, this display may be easier to fabricate than micro LED displays because all of the nanocolumns can be grown on a single substrate. This may significantly reduce the cost of the display.

Example Two of Nanocolumn-Based Display Design

Figure 11:
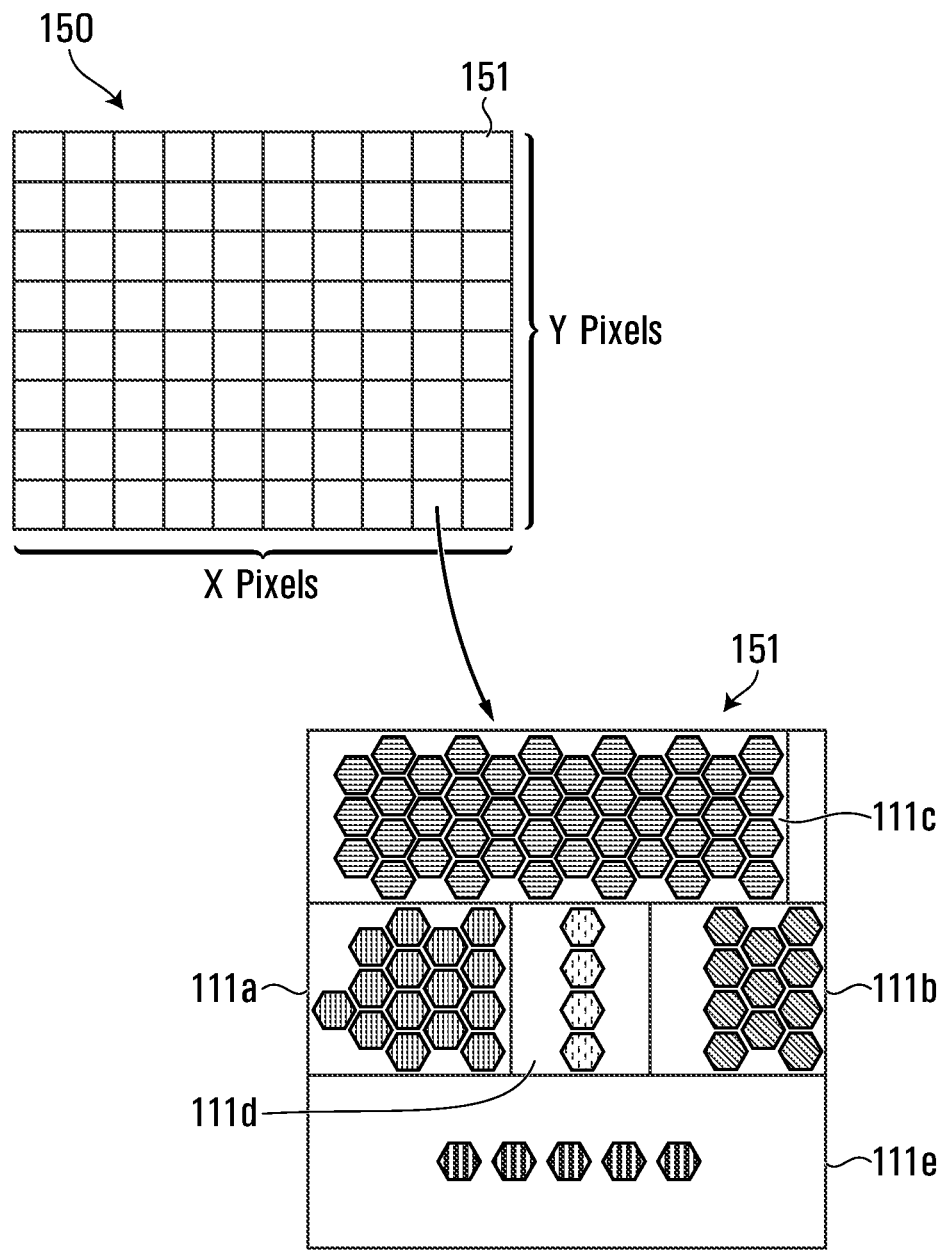
FIG. 11 is a schematic diagram of an exemplary display comprising a number of pixels each having five subpixels.

The second exemplary display is illustrated in FIG. 11 and provides an enhanced energy-efficient, penta-chromatic display. Each pixel 151 of the display 150 may include five subpixels 111a, 111b, 111c, 111d, 111e with wavelengths of 635 nm, 530 nm, 450 nm, 570 nm and 420 nm respectively. The first three subpixels may emit light at wavelengths which can be combined to provide light which is a substantial part of the visible spectrum. These subpixels will be the same as in the first example including the number of nanocolumns they contain.

The remaining two subpixels may emit light that corresponds to the wavelength of maximum sensitivity for red and blue cones. At maximum sensitivity, less luminosity is required to produce the same effect in the human eye. This translates to lower current, thus lower power consumption. The number of nanocolumns in these two subpixels will be less as the sensitivity of the cones is higher.

An algorithm may be used to select intensities of these five subpixels to achieve the desired color in a pixel. In some applications the red and blue subpixels whose respective cones have low sensitivity may not necessarily be used. They are not required for the desired color. The higher sensitivity subpixels may be used instead.

While it is possible to provide sufficient nanocolumns for the first and third wavelengths to provide the same peak brightness for all colors, it is also possible to reserve full (or near full) CIE color gamut display for indoor or head-mounted display applications where lower intensity of display is acceptable. For smartphones, tablets, wearable devices, and graphic displays that need to operate when exposed to daylight and, in the extreme, to direct sunlight, greater display brightness is required. Such brightness can be reserved for other chosen wavelengths at which the cones are more sensitive, thus saving display power, even if such wavelengths do not allow for achieving the same full or near full CIE color gamut.

It will be appreciated that when a low brightness regime and a high brightness regime are provided, the division of drive signal power to the subpixels varies depending on the regime. In the low brightness regime, all of the subpixels are used to provide the desired pixel color. In the high brightness regime, the violet and deep red subpixels are either off or are used to make a reduced contribution to the brightness of the pixel at the desired color within the reduced CIE color gamut.

To achieve the two different color regimes discussed above, the display may be controlled by a control system. The control system may include an environmental brightness sensor configured to sense the brightness in which the screen is being viewed. When the brightness sensor senses a brightness below a certain threshold, the control system may command the display to use all five subpixels. This command may be carried out by providing voltage to all five subpixels. When the brightness sensor senses a brightness above the threshold, the control system may command the display to use only three subpixels, for example, by providing voltage only to those subpixels. In some embodiments, the control system may include a user interface which may allow a user to manually switch between the two different regimes.

One skilled in the art will appreciate that the control system discussed here could be used in conjunction with a variety of subpixel configurations to provide different color schemes in different environment lightings. This may allow a display according to the present disclosure to be very efficient while displaying a wide color gamut. Further, such a control system could be used to switch the display between any number of display regimes and could depend on any environmental sensor.

As discussed above, the display illustrated in FIG. 11 may be very efficient while providing light along the nearly entire visible spectrum. The subpixels 111a, 111b, 111c emitting light at 635 nm, 530 nm, and 450 nm can be combined to produce any color defined by these primary wavelengths and can be seen in the CIE color space chart. Subpixels 111d and 111e at 570 nm and 420 nm respectively, are to reduce the power consumption as the color space that can be generated by these subpixels will be not as large but being at the peak sensitivity of the blue and red cones, combined with 530 nm emitter from the first three, will be very efficient.

Because 530 nm, 420 nm and 570 nm are near the peaks of the cone activations, the subpixels emitting those wavelengths require very little power and few nanocolumns to achieve a desired luminosity. This can be seen in FIG. 11 where fewer nanocolumns emitting light at these wavelengths are required. 635 nm and 450 nm are not near activation peaks for the cones and thereby the subpixels 111a, 111c emitting light at 635 nm and 450 nm may require more power and more nanocolumns.

In some embodiments, a nanocolumn-based display can be treated to improve its contrast. Contrast may be the difference between highlights and shadows in an image and/or the difference between the light being emitted by the display and the luminosity of the background. Contrast may be measured as a ratio. Contrast may be limited by the amount of ambient light reflected from the display and from any light that leaks from the nanocolumns into the space between the nanocolumns.

The contrast of a nanocolumn-based display may be improved by using one or more of the following methods. First, contrast enhancement color filters may be placed on the emission surface. These filters may improve the contrast by selecting a filter color that matches the color of the display. For example, red, blue, and green filters may be selected for RGB displays which use three subpixels. These filters may eliminate all ambient light of other colors and absorb a part of the light transmitted through the filter. As the result, the background may be blackened, and the color of the display may appear brighter. Second, light control film coatings (also referred to as antireflective films) may be applied to the front surface of a display. These coatings may absorb ambient light in areas between the pixels by absorbing photons emitted from the spaces between the nanocolumns. Third, light polarizers may be used. After the passing a polarizer ambient light may be modified and trapped by a filter. The pixel light passing through the filter may appear as a bright light against a dark background produced by the ambient light.

Background emission of light escaping through nanocolumn walls may be reduced by filling the space between the nanocolumns with a light absorbing material. This may reduce the side wall emission and increase the contrast. Such a method may be used in addition to the method described elsewhere to reflect the photons being emitted from the side walls back into the nanocolumn which may also contribute to higher contrast.

The fabrication methods and resultant properties described above may apply to nanocolumn devices which serve as displays, such as smartphone displays. They may also apply to devices fabricated for the purpose of illumination or as sources of light and to devices which are used to project images onto a retina or surfaces that may be used for microdisplays for digital camera's view finders and virtual/augmented reality head mounted displays, or other similar purposes. In these devices, nanocolumns are similarly fabricated, and groups are created for the desired color gamut and intensity. The calculations described herein may also be applied to any type of nanocolumn device.

In the case of an illumination device, color temperature can be tuned by using two or more colors. Using more wavelengths can provide lighting that feels more natural, as is the case with natural daylight. The driver can provide a controlled and variable current to each group of different wavelength nanocolumns to change the color temperature, if desired, or the device can be designed to provide a fixed wavelength composition. When the optical arrangement blends the light output from the device, it is possible to have the different wavelength groups of nanocolumns arranged as large blocks or macro subpixels (instead of providing closely interleaved subpixels) that would be noticed as distinct color blocks when looking directly at the device but that would be mixed by the optical arrangement so as to present a single hue of illumination.

What is claimed is:

1. A method of manufacturing a monolithic nanocolumn light emitting device, the method comprising:
   applying a metal coating on a p-doped end of an array of gallium-nitride (GaN) nanocolumns, said metal coating having a thickness sufficient to bond to the p-doped end of the array of GaN nanocolumns while being thin enough to be of low absorption of light emitted from a light emitting region of each nanocolumn of said array of GaN nanocolumns;
   coating each nanocolumn of said array of GaN nanocolumns with an insulating material, wherein said insulating material is in direct contact with and covers sidewall surfaces of said each nanocolumn over a full length of said each nanocolumn, said full length extending from a bottommost surface of an n-doped end of said each nanocolumn of the GaN nanocolumns, to a topmost surface of said p-doped end of said each nanocolumn of the GaN nanocolumns;
   coating said insulating material of each nanocolumn of said array of GaN nanocolumns with a reflective material to aid in guiding light in said nanocolumns to an exit window; and
   applying an array of reflective conductive contacts each covering said metal coating of a number of said GaN nanocolumns representing a pixel or subpixel for reflecting said light to an exit window, wherein said metal coating provides reduced electric resistance between the p-doped end of the array of GaN nanocolumns and the reflective conductive contacts.

2. The method as defined in claim 1, further comprising growing said array of GaN nanocolumns on a buffer layer of n-doped GaN, said n-doped GaN being able to provide a common contact and said exit window.

3. The method as defined in claim 1, further comprising attaching a driver semiconductor substrate having surface contacts connected to said array of reflective conductive contacts.

4. The method as defined in claim 1, further comprising filling an interstitial space between each nanocolumn of said array of GaN nanocolumns with an interstitial filler material.

5. The method as defined in claim 4, wherein said filler material is a light absorbing material.

6. The method as defined in claim 1, wherein said array of GaN nanocolumns comprise subpixels groups emitting light at different wavelengths depending on a width of each nanocolumn of said array of GaN nanocolumns.

7. The method as defined in claim 1, wherein said light emitting region of each nanocolumn of said array of GaN nanocolumns are in a polar c-plane or in a semi-polar plane.

8. The method as defined in claim 1, wherein said metal coating comprises nickel and gold, said nickel being deposited first with said gold being deposited on said nickel and heat treated to bond to the p-doped end of the array of GaN nanocolumns.

9. The method as defined in claim 8, wherein said metal coating is about 6 nm thick and contains nickel and gold.

10. A method of manufacturing a monolithic nanocolumn light emitting device, the method comprising:
    vertically growing an n-doped first end region for each nanocolumn of an array of gallium-nitride (GaN) nanocolumns on a buffer layer of n-doped GaN, said buffer layer being able to provide a common contact and an exit window;
    vertically growing a light emitting region on said first end region for each nanocolumn of said array of GaN nanocolumns, wherein a width of said light emitting region is of equal width of said first end region for each of the GaN nanocolumns;
    vertically growing a p-doped second end region on said light emitting region for each nanocolumn of said array of GaN nanocolumns, wherein a width of said second end region is of equal width of said first end region and said light emitting region for each nanocolumn;
    spin coating an interstitial filler material between each nanocolumn of said array of GaN nanocolumns;
    polishing said p-doped second end regions of said array of GaN nanocolumns;
    applying a metal coating on said p-doped second end regions of said array of GaN nanocolumns, said metal coating having a thickness sufficient to bond to the p-doped second end regions of the array of GaN nanocolumns while being thin enough to be of low absorption of light emitted from said light emitting region of each nanocolumn of said array of GaN nanocolumns;
    applying an array of reflective conductive contacts each covering said metal coating of a number of said GaN nanocolumns representing a pixel or subpixel for reflecting said light to said exit window, wherein said metal coating provides reduced electric resistance between the p-doped second end regions of said array of GaN nanocolumns and the reflective conductive contacts.

11. The method as defined in claim 10, further comprising attaching a driver semiconductor substrate having surface contacts connected to said array of reflective conductive contacts.

12. The method as defined in claim 10, further comprising:

coating each nanocolumn of said array of GaN nanocolumns with an insulating material, wherein said insulating material covers sidewall surfaces over a full length of each nanocolumn, said full length extending over an n-doped end, a light emitting region and said p-doped end of each nanocolumn; and coating said insulating material of each nanocolumn of said array of GaN nanocolumns with a reflective material to aid in guiding light in said nanocolumns to said exit window.

13. The method as defined in claim 10, further comprising coating each nanocolumn of said array of GaN nanocolumns with a dielectric reflective material covering sidewall surfaces over a full length of each nanocolumn, said full length extending over an n-doped end, a light emitting region and said p-doped end of each nanocolumn.

14. The method as defined in claim 10, wherein said interstitial filler material is a light absorbing material.

15. The method as defined in claim 10, wherein said array of GaN nanocolumns comprise subpixels groups emitting light at different wavelengths depending on a width of each nanocolumn of said array of GaN nanocolumns.

16. The method as defined in claim 10, wherein said light emitting region of each nanocolumn of said array of GaN nanocolumns are in a polar c-plane or in a semi-polar plane-to emit light directed to said first end and to said second end.

17. The method as defined in claim 10, wherein said metal coating comprises nickel and gold, said nickel being deposited first with said gold being deposited on said nickel and heat treated to bond to the p-doped second end regions of the array of GaN nanocolumns.

18. The method as defined in claim 15, wherein said metal coating is about 6 nm thick and contains nickel and gold.

* * * * *